United States Patent [19]

Lepselter et al.

[11] E Patent Number: Re. 32,613

[45] Reissued Date of Patent: Feb. 23, 1988

[54] METHOD OF MAKING CONTACT ELECTRODES TO SILICON GATE, AND SOURCE AND DRAIN REGIONS, OF A SEMICONDUCTOR DEVICE

[75] Inventors: Martin P. Lepselter, Summit; Simon M. Sze, Berkeley Heights, both of N.J.

[73] Assignee: American Telephone and Telegraph Company, AT&T Bell Laboratories, Murray Hill, N.J.

[21] Appl. No.: 756,924

[22] Filed: Jul. 19, 1985

Related U.S. Patent Documents

Reissue of:

[64] Patent No.: 4,343,082
Issued: Aug. 10, 1982
Appl. No.: 141,120
Filed: Apr. 17, 1980

U.S. Applications:

[63] Continuation of Ser. No. 641,849, Aug. 17, 1984.

[51] Int. Cl.[4] ..... H01L 21/265; H01L 29/72; C23F 1/02

[52] U.S. Cl. ..... 437/29; 357/15; 357/67; 357/91; 437/39; 437/89; 437/170; 437/200

[58] Field of Search ..... 29/576 B, 571, 578; 148/1.5, 187; 357/15, 67, 91; 427/84

[56] References Cited

U.S. PATENT DOCUMENTS

| | | | |
|---|---|---|---|
| 4,026,742 | 5/1977 | Fujino | 427/88 |
| 4,038,107 | 7/1977 | Marr et al. | 148/1.5 |
| 4,056,642 | 11/1977 | Saxena et al. | 427/84 |
| 4,096,622 | 6/1978 | McIver | 29/578 |
| 4,107,835 | 8/1978 | Bindell et al. | 29/590 |
| 4,109,372 | 8/1978 | Geffken | 29/571 |
| 4,116,721 | 9/1978 | Ning et al. | 148/1.5 |
| 4,128,670 | 12/1978 | Gaensslen | 427/93 |
| 4,141,022 | 2/1979 | Sigg et al. | 357/23 |
| 4,173,818 | 11/1979 | Bassous et al. | 29/571 |
| 4,180,596 | 12/1979 | Crowder et al. | 427/93 |
| 4,319,395 | 3/1982 | Lund et al. | 29/571 |
| 4,384,301 | 5/1983 | Tasch, Jr. et al. | 357/23 |

OTHER PUBLICATIONS

Ottaviani et al. Phys. Rev. Letts. 44 (Jan. 1980) 284.
Tsaur et al. Appl. Phys. Letts. 34 (1979) 168.
Tsaur et al. Appl. Phys. Letts. 35 (Aug. 1979) 225.

*Primary Examiner*—Upendra Roy
*Attorney, Agent, or Firm*—David I. Caplan

[57] ABSTRACT

In the fabrication of a metal oxide semiconductor field effect transistor (MOSFET) or of a metal gate field effect transistor (MESFET), characterized by a polycrystalline silicon gate (13) and a short channel of about a micron or less, a sequence of steps is used involving the simultaneous formation of source, drain, and gate electrode contacts by a bombardment with a transition metal, such as platinum, which forms metal-silicide layers (19, 21, 18) on the source and drain regions (10.1, 10.2) as well as the silicon gate electrode (13).

10 Claims, 7 Drawing Figures

METHOD OF MAKING CONTACT ELECTRODES TO SILICON GATE, AND SOURCE AND DRAIN REGIONS, OF A SEMICONDUCTOR DEVICE

Matter enclosed in heavy brackets [ ] appears in the original patent but forms no part of this reissue specification; matter printed in italics indicates the additions made by reissue.

*This application is a continuation, of application Ser. No. 641,849, filed Aug. 17, 1984, which was a reissue of U.S. Pat. No. 4,343,082, dated Aug. 10, 1982.*

FIELD OF THE INVENTION

This invention relates to the field of semiconductor apparatus, and more particularly to short channel field effect transistors and methods for making them.

BACKGROUND OF THE INVENTION

It has been recognized by workers in the art of metal oxide semiconductor field effect transistor (MOSFET) structures that a shallow source or drain diffusion (small junction depth) can yield desirable device characteristics. For example, in an article by R. Hori et al. entitled "Short Channel MOS-IC Based on Accurate Two-Dimensional Device Design", published in Supplement to Japanese Journal of Applied Physics, Vol. 15, pp. 193–199 (1976), it was recognized that relatively shallow source and drain junction depths could help yield a relatively low threshold voltage shift in a short-channel MOSFET structure as well as a relatively high punch-through breakdown voltage. By "short-channel" is meant a source to drain separation of less than about 2 microns. Short-channel MOSFET structures are desirable from the standpoint of high frequency operation (of the order of 1 GHz) and miniaturization of size, particularly in very large scale integration of various semiconductor circuits, such as in a memory array in which each memory cell contains such a short-channel MOSFET.

A short-channel MOSFET made by conventional techniques suffers from undesirable device properties stemming from a relatively high parasitic capacitance between the polycrystalline silicon ("polysilicon") gate electrode and the source or drain (or both). Similarly, a conventionally fabricated short-channel metal gate (Schottky barrier) field effect transistor (MESFET) device structure suffers from the problem of undesirably high ohmic resistance along a path from source or drain electrode (or both) to the conducting portion of the channel during operation in the ON state of the device. It would, therefore, be desirable to have a method for making short-channel transistors alleviating these problems.

SUMMARY OF THE INVENTION

In order to fabricate a short-channel polysilicon gate transistor, with low parasitic characteristics, platinum silicide electrode contacts (15, 16, 17) to the gate and source and drain are formed during a bombardment with platinum (FIG. 4) of the then exposed surfaces of the polysilicon gate, the source, and the drain. Instead of platinum, other transition metals can be used which form a metal-silicide. At the time of this bombardment, the side edge surface—but not the top surface—of the polysilicon gate has advantageously been previously coated with a silicon dioxide layer (14). The parameters controlling this platinum bombardment are adjusted so that while platinum silicide is being produced on the exposed surfaces of the polysilicon gate, the source, and the drain—all of which are of silicon—neither any platinum nor platinum silicide accumulates on the exposed surface of the silicon dioxide layer 14. Likewise, during this platinum bombardment, neither platinum nor platinum silicide accumulates on any other exposed silicon dioxide layer (11) may have been previously formed as for the purpose of device isolation.

This invention thus involves a method for making a transistor device in a silicon semiconductor body (10), said device (20, or 30, FIG. 6 or FIG. 7) having a gate electrode layer contact (15) to a polycrystalline silicon gate electrode (13) during a stage of manufacture of said device, a source electrode layer contact (16), and a drain electrode layer contact (17), characterized in that subsequent to formation of said polycrystalline gate electrode (13) with its side edges coated by a silicon dioxide layer (14), said gate and source and drain electrode contacts (15, 16, 17) are all simultaneously formed by a bombardment of body (10) with a transition metal capable of forming a silicide while the body (10) is being subjected to applied electrical voltage ($E_2$, FIG. 4) of such strength and frequency that silicide of said metal is produced at a pair of then exposed regions (10.1, 10.2) contiguous with a major surface of the body (10) to form said source and drain electrode contacts (16, 17) and that said silicide is produced during such bombardment at the then exposed regions of the polycrystalline silicon gate electrode (1) to form said gate electrode contact (15), and that essentially no silicide accumulates on the silicon dioxide coating (14). Any metal that accumulates on this oxide can then be removed by conventional etching. The bombardment with the metal can be accomplished by sputtering the metal from a target (31) of said metal.

The device structures that can be fabricated with the method of this invention include field effect transistor structures of the insulated gate (FIG. 6) or conductive gate (FIG. 7) of the Schottky barrier or junction field effect type.

BRIEF DESCRIPTION OF THE DRAWINGS

This invention, together with its features, objects, and advantages, may be better understood from the following detailed description when read in conjunction with drawings in which.

Figure 1:
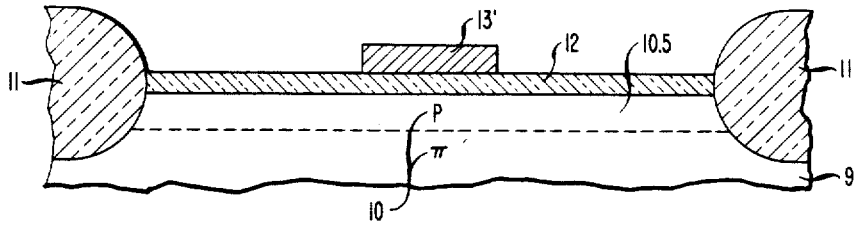
FIGS. 1–6 illustrate in cross section a sequence of various stages in the fabrication of a transistor device, specifically a MOSFET, in accordance with a specific embodiment of the invention.

Only for the sake of clarity, none of the drawings is to any scale.

DETAILED DESCRIPTION

As shown in the sequence of drawings, FIGS. 1–6, a short-channel MOSFET device 20 (FIG. 6) can be fabricated, in accordance with the invention, on a top major surface of a monocrystalline semiconductive silicon body 10. As shown in the art of semiconductor multiple device fabrication ("batch techniques"), many similar MOSFET devices can be simultaneously fabricated in such a body, all of these devices being mutually electrically isolated by relatively thick ("field") oxide region 11.

The body 10 is formed by a single crystal semiconductor bulk portion 9 upon a major planar surface of which has been grown an epitaxial semiconductor layer 10.5. Typically, the semiconductor 9 is $\pi$-type conductivity silicon; that is, having a relative low P-type conductivity, for example, a bulk conductivity of about 10 ohm cm. The epitaxial layer 10.5 is advantageously of moderate electrical conductivity, typically P-type, owing to a net significant acceptor impurity concentration ordinarily of the order of about $10^{15}$ to $10^{17}$ per $cm^3$, typically about $10^{16}$ per $cm^3$. The thickness of this epitaxial layer is typically about one or two micron or less.

In order to fabricate the MOSFET device 20 (FIG. 6), a thin ("gate oxide") silicon dioxide layer 12 (FIG. 1) is thermally grown on the exposed portion of the top surface of the body 10 typically to a thickness of about a few hundred angstrom. Either before or after the formation of this thin oxide layer, relatively thick oxide regions 11 are embedded, by means of a conventional thermal oxidation process, at selected portions of the epitaxial P layer down to the underlying $\pi$-type original crystal, in order to provide conventional oxide isolation between neighboring devices. It should be understood that electron beam or x-ray lithography, as well as photolithography, can be used in combination with standard resist masks to define the areas of selective formation of the thick oxide. Then an electrically conductive N-type polycrystalline silicon layer 13' is deposited on a pre-selected area of the exposed surface of the thin oxide as formed by conventional resist masking and etching techniques applied to a polycrystalline layer originally deposited all over the top surface, using lithography (electron beam, x-ray, or photo) techniques to shape the mask. This polycrystalline layer 13' is typically N-type semiconductor owing to its being doped with significant donor impurities—such as arsenic—to increase its electrical conductivity, and it has a length of typically about 1.0 micron in the direction of the source to drain channel of the completed device and a width of typically a few microns in the transverse direction thereto. This polysilicon layer is thus useful as the gate electrode of the completed transistor device.

Figure 2:
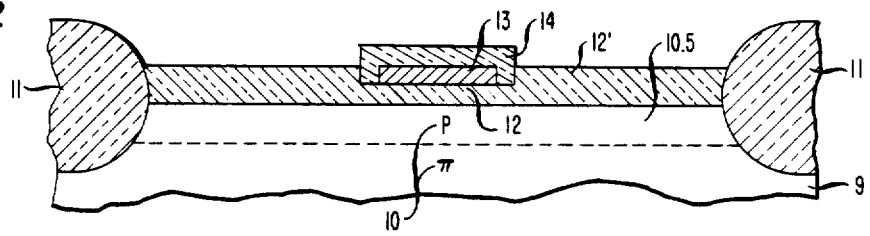
Figure 3:
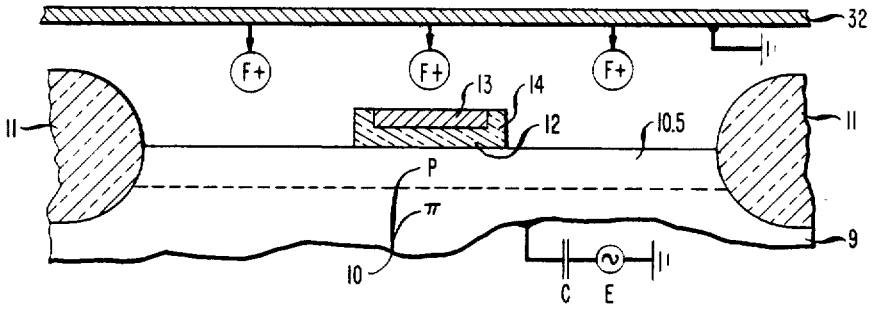

Next, the exposed top and side surfaces of the polycrystalline silicon layer 13' are subjected to a conventional oxidation technique, which oxidizes the polycrystalline silicon to yield a thin silicon dioxide coating layer 1 on the surfaces of the thus remaining, unoxidized N-type polycrystalline layer 13 (FIG. 2). Typically, this oxide coating 14 has a thickness of about 500 angstrom. As a result of this oxidation of the polycrystalline layer, the thickness of the original oxide layer 12 (FIG. 1) is increased somewhat, as indicated by oxide layer 12' (FIG. 2).

Then, the exposed portion of the thin oxide layer 12' and the top portion (but not side portions) of the thin oxide layer 14 are removed (FIG. 3) by an anisotropic etching technique, such as chemically reactive back-sputtering (reactive ion etching) with fluoride ions (F+) in a plasma produced by $CHF_3$. By "anisotropic[ etching it is meant etching preferentially in the direction perpendicular to the major surface of the body 10. For example, a cathode plate 32, typically of platinum, is located at a distance typically of several inches from the body 10 in an evacuated chamber (not shown). This body is mounted on an electrically conducting plane (not shown) connected through a capacitor C to an RF voltage source E, typically about 500 volts peak to peak at a frequency in the range of about 200 KHz to 14 MHz, typically 13.5 MHz. The pressure in the chamber is reduced to below about 1 mm Hg, typically about 50 micron Hg, in order that, while a plasma forms in the neighborhood of the cathode plate 32, the top surface of the epitaxial layer 10.5 remains inside a dark space region of the discharge from the cathode plate 32. The RF power is typically about 20 to 100 watts for a cathode several inches in diameter, and the temperature of the body is maintained at typically about 500° C. In this manner, the fluoride ions bombarding any element (including the oxide and polysilicon layer) located at the top surface of the body 10 strike it from a direction which is essentially normal to the top major surface of the epitaxial layer 10.5; thereby these ions completely remove the thin oxide only at the surface portions where the normal to the surface is parallel to the velocity vector of the bombarding ion, but not at the side portions. In so removing the thin oxide portions, however, it is important that the side surfaces of the polysilicon layer 13 thus remain coated with the thus remaining (sidewall) portions of the oxide layer 14. The thickness (in the horizontal direction) of this remaining sidewall oxide is typically about 500 angstrom, and is in any event advantageously equal to, or less than, approximately the Debye length in the silicon in the region of the source-channel interface of the ultimately completed device.

Figure 4:
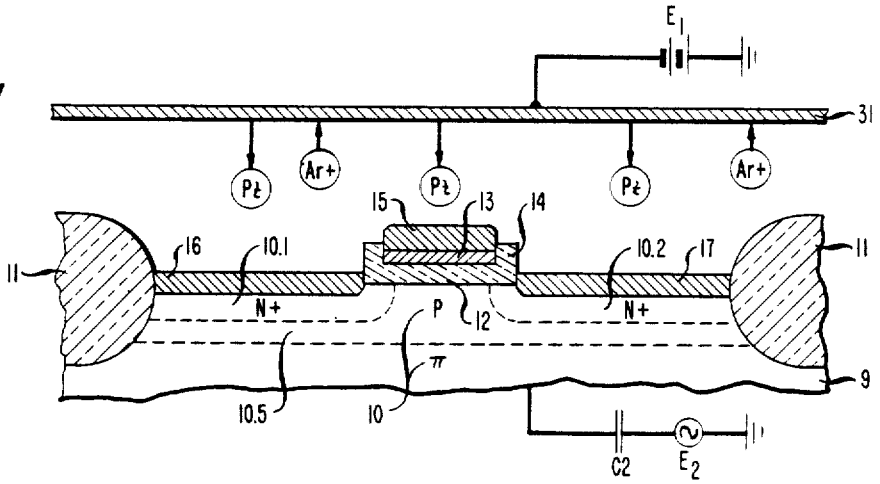
Figure 5:
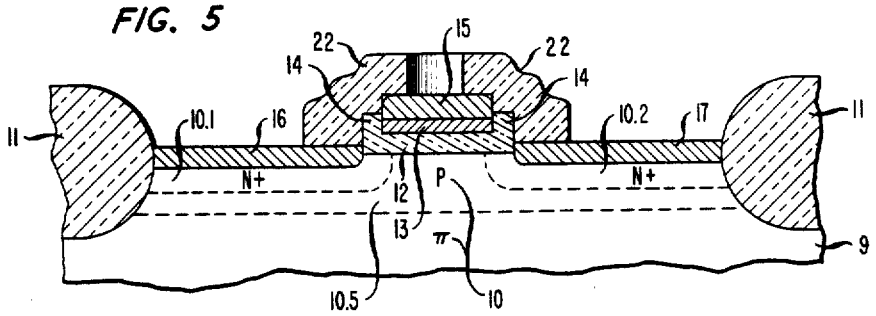

Next, as indicated in FIG. 4, positively charged argon ions are directed upon a platinum cathode target 31 in order to sputter platinum from the target onto the body 10. These positive argon ions have suitable kinetic energies due to an accelerating voltage $E_1$ (of negative polarity) applied to the target. This sputtering of platinum results in the arrival of platinum atoms and/or platinum ions at the exposed top surface of the epitaxial layer 10.5 where the platinum accumulates on the exposed silicon as metal-like platinum silicide electrode layers 15, 16 and 17. The voltages $E_1$ and $E_2$ are adjusted so that the removal rate of platinum from the exposed oxide portions of the top surface is greater than the arrival rate. Thus, essentially no metal or metal-like substance of any kind (platinum or platinum silicide) accumulates on any portion of exposed oxide, either the field oxide or the gate oxide. However, if any metal should accumulate on the oxide, a subsequent treatment with a conventional etching solution, as aqua regia, can be used to remove this metal but not the silicide or oxide layers.

The donor impurity dopant arsenic or antimony (or both) can advantageously be added to the target 31 for the purpose of simultaneously forming by "co-sputtering" a pair of spaced apart, self-aligned N+ zones 10.1 and 10.2 during the bombardment with platinum. These N+ zones are formed by rejection from the platinum silicide of the impurity dopant into the silicon ("segregation coefficient"). Because all subsequent processing temperatures are well below the temperature at which significant diffusion of impurities in silicon occurs, the depth of the resulting N+ P junctions in the silicon (beyond the platinum silicide) can be as little as 100 angstrom or less.

Alternatively, the N+ zones 10.1 and 10.2 can be formed at an earlier stage of the fabrication—for example, by means of conventional techniques as ion implantation and diffusion of donor impurities using the polycrystalline layer 13 with sidewall oxide 14 as a mask which is impervious to these impurities.

Typical values of the parameters useful for this platinum bombardment step are: $E_1$ is a D.C. voltage equal to about 1000 volts, and $E_2$ is an RF voltage in the range of typically about 500 to 1000 volts peak to peak at a frequency of about 13 MHz. The RF power is typically about 20 to 100 watts for a cathode 31 of several inches in diameter. The frequency and amplitude of $E_2$ control the removal rate of platinum and platinum silicide during the bombardment. The fact that the removal rate of platinum is thus made to be about two or more times that of platinum silicide tends to ensure the net removal of any metallic platinum initially arriving on the exposed oxide while the net permanent formation and accumulation of platinum silicide occurs on the exposed silicon (whether monocrystalline or polycrystalline). The temperature of the body 10 during this sputtering process is typically about 625° C., while the ambient pressure of argon is typically about 10 to 20 micron Hg.

Figure 6:
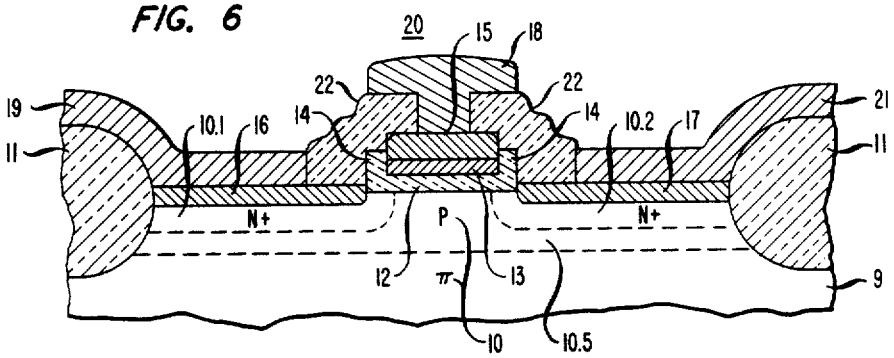

After the formation of the platinum silicide layers 15, 16 and 17 on the exposed silicon surfaces to a thickness of typically about a few hundered angstrom, the top surface of the body 10 is coated at selected areas with an insulating layer 22 (FIG. 5) by conventional deposition, masking, and etching techniques. This layer 22 is typically tetra-ethyl-ortho-silicate having a thickness of, for example, about 5000 angstrom. By conventional techniques, metallization such as aluminum is then applied through apertures in the layer 22 to contact the platinum silicide layers 15, 16, and 17, in order to form the respective electrode metallization contacts 18, 19, and 21 for the gate, source, and drain, respectively, of the completed MOSFET device 20 (FIG. 6).

It should be noted that during operation, a back-gate (substrate) bias voltage of magnitude two volts or more is desirable, in order to prevent short circuits of different devices due to surface channels under the thick (field) oxide. Alternatively, such channels can be avoided by using a v-type (low conductivity N-type) body 10.

For good transistor device performance, it is useful to have the source and drain regions 10.1 and 10.2 as shallow as possible; that is, the implantation process for these regions should limit their depths beneath the surface of the semiconductor body to a value of about a few hundred angstrom, which can be achieved by using a semiconductor body temperature of no greater than 500° C. during any fabrication step subsequent to the diffusion of these N+ zones.

Figure 7:
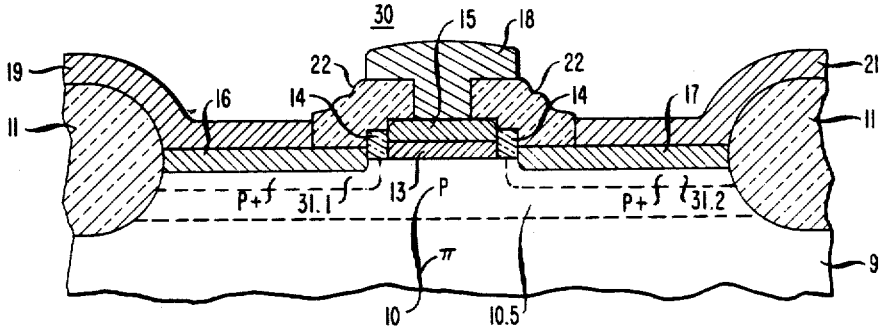
FIG. 7 illustrates in cross section the final stage of another transistor device, specifically a MESFET, in accordance with another specific embodiment of the invention.

As illustrated in FIG. 7, the growth of the thin oxide layer 12 can be completely omitted, so that the N-type polycrystalline silicon layer 13 directly contacts the top surface of the silicon semiconductor body 10, thereby forming a PN junction thereat. The resulting device 30 is thus an equivalent of a junction FET device, ("JFET"). In this device (FIG. 7), the N+ regions 10.1 and 10.2 advantageously are replaced by P+ regions 31.1 and 31.2, respectively, so that the device has a relatively low barrier Schottky source and a relatively low barrier Schottky drain; for example, a barrier of 0.25 volts in the case of platinum silicide on P-type silicon. Conversely, on this P-type silicon, a relatively high Schottky barrier of about 0.65 volt is formed by hafnium, for example.

The distance between drain and gate can be made larger than that between source and gate, by locating the electrode 17 farther away from the polysilicon layer 13, so that this electrode does not directly physically contact the oxide layer 14, in order to provide a longer drift region in the neighborhood of the drain. On the other hand, the P+ regions 31.1 or 31.2 (or both) can be omitted in the device illustrated in FIG. 7. Also, care must be taken that the diffusion of these regions 31.1 and 31.2 does not extend either of these regions laterally to the polycrystalline layer 13; otherwise, an undesirable short circuit of the gate electrode to source or drain (or both) will occur.

Moreover, again omitting the thin oxide layer 12, a metal gate FET ("MESFET") structure can be obtained by carrying out the metal bombardment step (FIG. 4) for sufficiently long a time that the polycrystalline layer 13 is complete converted to metal-silicide. In such a case it is advantageous to use a relatively high barrier Schottky metal such as hafnium for the P-type silicon layer 10.5 (platinum for N-type silicon), advantageously together with a pair of localized diffused P+ type zones instead of the localized N+ zones 10.1 and 10.2 in the P-type silicon layer 10.5 (or to retain the localized N+ zones 10.1 and 10.2 but in an N-type epitaxial layer instead of the P-type layer 10.5). Again, each (or both) of the localized diffused zones can be omitted (especially at the source region), whereby the source or (and) the drain can be of the Schottky barrier type.

Instead of growing the epitaxial P-type layer 10.5, the top surface of the original $\pi$-type semiconductor base 9 can be treated with excess acceptor impurities. This $\pi$-type base 9 contains about $10^{16}$ per $cm^3$ excess significant acceptor impurities. In an example, solely for illustrative purposes, upon the top surface of the original $\pi$-type base 9 are successively formed a 350 angstrom thermally grown layer of silicon dioxide and a 1200 angstrom layer of silicon nitride. Using a photo or x-ray or electron beam resist material as a mask, the silicon nitride layer is removed from the areas where the thick isolation oxide is to be formed; that is, the nitride layer is removed only in the complement of the GASAD (gate and source and drain) areas. Leaving the resist in place as an impervious mask against ion implantation, a channel ("chan") stop is formed by implanting boron ions of typically about 100 kev to a dose of typically about $10^{12}$ to $10^{13}$ per square centimeter in the complement of the GASAD areas. Then, the resist material is removed, leaving the nitride layer in place; and a thick 9000 angstrom field oxide layer is thermally grown in the field oxide areas (complement of the GASAD areas) while the top portion of the nitride layerin the GASAD areas is converted into an oxynitride layer. Next, successively using etching solutions of buffered hydrofluoric acid and phosphoric acid, the oxynitride and nitride layers, respectively, are successively removed from the GASAD areas while only a small fraction of the oxide layer is thereby removed from the thick field oxide layer. Then, thermal growth produces a total of 3000 angstrom of silicon dioxide in the GASAD areas and a total of about 9500 angstrom of silicon dioxide in the field oxide area. Next, all the oxide in the GASAD areas is removed by etching with buffered hydrofluoric acid, while the field oxide thickness is reduced to about 6500 angstrom. Then another thermal growth step produces a layer of silicon dioxide in the GASAD areas having a thickness in the range of about 100 to 500 angstrom, typically 125 angstrom. Next, boron ions are implanted with 35 kev energy, sufficient to penetrate to the underlying silicon only in the GASAD areas, to a dose of $2\times10^{12}$ boron ions per square centimeter, in order to provide a convenient operating threshold voltage in the ultimate transistor devices of the enhancement mode type. If depletion mode devices are also to be formed at some of the GASAD areas, then a resist material is applied to these areas prior to the 35 kev boron ion implantation. This resist is then removed after this boron implantation, next, the oxide is completely removed from all the GASAD areas (a small fraction from the field oxide areas); and finally the oxide layer 12 (FIG. 1) is thermally grown. Although the invention has been described in terms of specific embodiments, various modifications can be made without departing from the scope of the invention. For example, the semiconductor base 9 can be v-type (low conductivity N-type) instead of $\pi$-type. Moreover, N-type and P-type conductivity can be everywhere interchanged in all the above-described devices.

Instead of using fluoride ions to remove the oxide (FIG. 3), other ions, such as argon, may be used; that is, either a chemically reactive or nonreactive ion etching may be used for the oxide removal step. Moreover, instead of platinum, other transition metals methods can be used, such as cobalt, hafnium, titanium, or tantalum, for example, each of which forms a metal-silicide suitable for a Schottky barrier on silicon. Moreover, the N+ region 10.1 or 10.2 (or both) can also be omitted from the device shown in FIG. 6, thereby forming a Schottky barrier source or drain (or both) in a MOSFET structure. Instead of forming the platinum silicide by sputtering, platinum itself can first be evaporated all over the surface and then be converted into platinum silicide by means of a temperature "spike" treatment typically of about 400° to 650° C. for typically about 2 to 6 minutes; the platinum remaining as such or the oxide can thereafter be removed by etching with hot aqua regia.

We claim:

1. A method for making transistor devices in a silicon semiconductor body (10), each said device (20 or 30, FIG. 6 or FIG. 7) having a gate electrode layer contact (15) to a polycrystalline silicon gate electrode (13) during a stage of manufacture of said device, a source electrode layer contact (16), and a drain electrode layer contact (17), including the steps of coating side edges of said polysilicon gate electrode (13) with a silicon dioxide layer (14), and forming said gate and source and drain electrode contacts simultaneously by [depositing on] *bombarding* said body (10) *with* a transition metal capable of forming a silicide to form, *during the bombarding*, silicide of said metal contacting a pair of then exposed regions (10.1, 10.2) contiguous with a major surface of the body (10), thereby to form said source and drain electrode contacts (16, 17), and simultaneously to form said silicide contacting the then exposed regions of the polycrystalline silicon gate electrode (13), thereby to form said gate electrode contact (15), whereby essentially no silicide accumulates on the silicon dioxide coating (14).

2. The method of claim 1 in which said step of forming comprises bombardment of said body with said transition metal while said body is being subjected to an applied electrical voltage ($E_2$) of predetermined strength and frequency, whereby essentially no *metal or metal*-silicide accumulates on an exposed surface of an oxide region (11) isolating said device from its neighbor in a multiplicity of such devices formed simultaneously in said body.

3. The method of claim 1 [or 2] including the further step of removing by etching any of said metal that accumulates on said silicon dioxide coating (14).

4. The method of claims 1 or 2 in which the step of forming is continued until the gate electrode layer (15) contacts the semiconductor body (10).

5. The method for making semiconductor apparatus comprising the steps of:

(a) forming a polycrystalline silicon layer covering a first silicon dioxide layer which coats a first portion of a major surface of a silicon semiconductor body;

(b) forming a second silicon dioxide layer on an exposed side edge of the polycrystalline silicon layer, leaving a major surface of a polycrystalline layer exposed and free of silicon dioxide;

(c) subjecting the body to a bombardment with a metal, which forms metal-silicide, from a target of said metal under the influence of predetermined voltage applied to said body whereby layers of metal-silicide are formed, *during the bombardment*, at the exposed portions of the major surfaces of the semiconductor body and of the polycrystalline silicon layer and whereby essentially no *metal or* metal-silicide is formed on any portion of the second silicon dioxide layer during the bombardment.

6. The method of claim 5 in which the metal is platinum, hafnium, cobalt, tantalum, or titanium.

7. A method for making semiconductor apparatus comprising the steps of:

(a) forming a polycrystalline silicon layer on a selected portion of a major surface of a semiconductor silicon crystal body;

(b) forming a second silicon dioxide layer on an exposed side edge of the polycrystalline silicon layer, leaving a major surface of a polycrystalline layer exposed and free of oxide;

(c) subjecting the body to a bombardment with a transition metal capable of forming metal-silicide under the influence of voltage applied to said body such that layers of said silicide are formed, *during the bombardment*, at the exposed portions of the major surfaces of the semiconductor body and of the polycrystalline silicon layer and that no *metal or* metal-silicide is formed on any portion of the second silicon dioxide layer during the bombardment.

8. The method of claims 6 or 7 in which said bombardment with metal is produced by sputtering from a target of said metal upon which ions of suitable kinetic energy are incident.

9. The method of claims 6 or 7 in which an oxide isolation layer of greater thickness than the first silicon dioxide layer is embedded in a second, separate portion of the major surface of the silicon body prior to the step of subjecting the body to the bombardment, whereby no *metal or* metal-silicide is formed on any portion of the oxide isolation layer.

10. The method of claim 9 in which the metal is platinum or hafnium.

* * * * *